United States Patent
Chae et al.

(10) Patent No.: US 8,410,972 B2
(45) Date of Patent: Apr. 2, 2013

(54) ADDER-EMBEDDED DYNAMIC PREAMPLIFIER

(75) Inventors: Jeongseok Chae, Carlsbad, CA (US); Gábor C. Temes, Corvallis, OR (US)

(73) Assignee: Asahi Kasei Microdevices Corporation, Tokyo (JP)

( * ) Notice: Subject to any disclaimer, the term of this patent is extended or adjusted under 35 U.S.C. 154(b) by 35 days.

(21) Appl. No.: 13/197,989

(22) Filed: Aug. 4, 2011

(65) Prior Publication Data
US 2012/0032831 A1 Feb. 9, 2012

Related U.S. Application Data

(60) Provisional application No. 61/370,522, filed on Aug. 4, 2010.

(51) Int. Cl.
*H04N 7/26* (2006.01)
(52) U.S. Cl. ......... 341/200; 341/143; 341/155; 330/253
(58) Field of Classification Search .................. 341/143, 341/155, 200
See application file for complete search history.

(56) References Cited

U.S. PATENT DOCUMENTS

| 5,055,846 A * | 10/1991 | Welland | 341/155 |
| 6,717,448 B2 * | 4/2004 | Heo et al. | 327/202 |
| 7,554,474 B2 * | 6/2009 | Le Guillou | 341/143 |

OTHER PUBLICATIONS

Lee, K. et al., "A Noise-Coupled Time-Interleaved Delta-Sigma ADC With 4.2 MHz Bandwidth, -98 dB THD, and 79 dB SNDR", IEEE Journal of Solid-State Circuits, Dec. 2008, pp. 2601-2612, vol. 43, No. 12.
Lee, K. et al., "Noise-Coupled ΔΣ ADCs", Electronics Letters, Nov. 23, 2006, 2 pp. vol. 42, No. 24.
Chae, J. et al., "A 63 dB 16 mW 20 MHz BW Double-Sampled ΔΣ Analog-to-Digital Converter with an Embedded-Adder Quantizer", IEEE, 2010, 4 pgs.
Schinkel, D. et al., "A Double-Tail Latch-Type Voltage Sense Amplifier with 18ps Setup+Hold Time", IEEE International Solid-State Circuits Conference, 2007, 3 pgs.
Schinkel, D. et al., "A Low-Offset Double-Tail Latch-Type Voltage Sense Amplifier", ProRISC 2007, 18th Annual Workshop on Circuits, Systems and Signal Processing, Nov. 29-30, 2007, 6 pages, Veldhoven, the Netherlands.
Silva, J. et al., "Wideband Low-Distortion Delta-Sigma ADC Topology", Electronic Letters, Jun. 7, 2001, pp. 737-738, vol. 37, No. 12.
Vleugels, K. et al. "A 2.5-V Sigma-Delta Modulator for Broadband Communications Applications", IEEE J. Solid-State Circuits, 2001, pp. 1887-1899, vol. 36, No. 12.
Zhang, Z. et al., "A Segmented Data-Weighted-Averaging Technique", IEEE Int. Symposium Circuits and Systems, May 2007, pp. 481-484, New Orleans.

* cited by examiner

*Primary Examiner* — Khai M Nguyen
(74) *Attorney, Agent, or Firm* — Maine Cernota & Rardin

(57) ABSTRACT

A method and apparatus for an adder-embedded dynamic preamplifier system with dynamic comparator and current mode adder including differential switches for precharging, a switch for evaluation; and reference, feedfoward input sections. When differential switches are closed, OUTN and OUTP are precharged. During the evaluation, discharging currents are proportionately determined by input and reference values. A following latch amplifies the discharging differences of OUTN and OUTP.

18 Claims, 7 Drawing Sheets

ADDER-EMBEDDED DYNAMIC PREAMPLIFIER

RELATED APPLICATIONS

This application claims the benefit of U.S. Provisional Application No. 61/370,522 filed Aug. 4, 2010; this application is herein incorporated in its entirety by reference.

FIELD OF THE INVENTION

The invention relates to the field of mixed-signal analog and digital design, particularly to dynamic preamplifiers which have the function of signal addition with wide bandwidths.

BACKGROUND OF THE INVENTION

High speed circuits forming components of analog to digital converters (ADCs) and digital to analog converters (DACs), including delta-sigma ($\Delta\Sigma$) modulators, are required to provide ever increasing performance. This involves conflicting attributes such as size, cost, complexity, power, speed, signal bandwidth, noise and stability. Products demanding this increased performance include data and signal transceivers in audio, video, and RF applications.

Approaches to improving the performance of modulators have included employing high order, low-distortion architectures. This involves an increased number of adder inputs and increased coefficients. While increasing the number of adder inputs can obtain more effective modulator feedback, instability can also increase. Furthermore, increasing coefficients can improve the noise transfer function (NTF); however, a result is an adder with a low feedback factor, $\beta$. This low $\beta$ results in high power consumption, contrary to applications' demands.

There are other approaches to adder design that attempt to improve performance. For example, a current mode adder. However, to provide increased bandwidth, this design requires large DC current, again contrary to applications' needs. These trade-offs cause restrictions on the operation speed and circuit density of their devices.

FIG. 1 is a block diagram 100 of a known third-order modulator including a conventional switched-capacitor-based active adder 105, detailed in FIG. 2. As mentioned, as the number of adder inputs and coefficients are increased, the adder feedback factor $\beta$ becomes lower, hence high power consumption to get wide bandwidth or good phase margin.

In the circuit of FIG. 1, input U 110 is applied to summing nodes 105 and 115. Output of summing node 115 is applied to input of integrator 120. Output of integrator 120 is applied to input of feedforward path 125 and input of summing node 130. Output of summing node 130 is applied to input of integrator 135. Output of integrator 135 is applied to input of feedforward path 140 and input of integrator 145. Output of integrator 145 is applied to input of feedback path 150, whose output is applied to summing node 130. Output of integrator 145 is also applied to summing node 105, whose output is applied to quantizer 155. Quantizer output is returned to summing node 115 by digital output feedback path with DAC 160 and also provides output V 165. Outlined section depicts embedded-adder quantizer 170.

FIG. 2 is a diagram 200 illustrating a conventional switched-capacitor-based active adder detail as from FIG. 1 when the adder is in the addition mode. $V_{IN}$ 205 corresponds to FIG. 1 input U 110, $V_{1st}$ 210 corresponds to FIG. 1 path 125, $V_{2nd}$ 215 corresponds to FIG. 1 path 140, and $V_{3rd}$ 220 corresponds to FIG. 1 output of integrator 145. For single-bit modulators, passive adders can be used before the quantizer, because dynamic range scaling lowers the adder gain. However, multi-bit modulators require active adders to realize the adder gain and to relax the design requirements of the quantizer. For the third-order modulator shown in FIG. 1, the feedback factor of the active adder is only ⅕, even without considering the parasitic input capacitance of the opamp. To reduce the swing and the power consumption of the first integrator, multi-level quantizers which increase the load capacitance of the adder are included. This effect only gets worse for higher-order modulators and higher-resolution quantizers. The bandwidth of the opamp needs to be wide, and hence large power is consumed in the adder.

FIG. 3 is a diagram 300 illustrating a known transconductance (gm)-cell-based current mode adder exhibiting large DC current consumption. Components include current sources 305, $V_{REF}$ current source 310, $V_{IN}$ current source 315, $V_{1st}$ current source 320, $V_{2nd}$ current source 325, and $V_{3rd}$ current source 330.

Each of these approaches involves negative tradeoffs among size, cost, complexity, power, speed, signal bandwidth, noise and stability. What is needed are techniques for improving performance without increasing power consumption or impacting bandwidth.

SUMMARY OF THE INVENTION

The invention provides a dynamic comparator with a current mode adder, whereby both power consumption and delay are reduced in the circuits and devices employing these circuits.

An embodiment related to FIG. 4 includes an adder-embedded dynamic preamplifier system (400) comprising at least a first precharge switch (402) and a second precharge switch (404); at least a discharge switch (408); and a plurality of Gm sections (412, 414, 416, 418, 420), each comprising at least a differential pair of transistors (for example 426, 428 (for 412)) and a pair of resistors (for example 430 (for 412)), thereby providing a Gm cell; wherein one of the Gm sections (412) receives reference signals (refp, refn), another each of the Gm sections (for example 414, 416, . . . ) receives input signals (for example v1p, v1n v2p, v2n . . . ); wherein the preamplifier system (400) generates two output signals; the output signals comprising (OUTP, OUTN) summation of the output signals of the plurality of Gm sections (412, 414, 416, 418, 420); wherein the plurality of Gm sections (412, 414, 416, 418, 420) are precharged by the at least a first precharge switch and a second precharge switch (402, 404) and the plurality of Gm sections are discharged by the at least a discharge switch (408). In another embodiment, each resistor of the pair of resistors (for example 438 (if 414)) determines gain of each of the Gm cells for each of the input signals (for example v1n, v1p) for a function of subtraction; and wherein each ratio of each of the resistors (for example 438 (if 414)) decides each Gm (or gain) ratio of each of the first input signals (for example v1n, v1p) for a function of subtraction. For a following embodiment, each of the first and the second input signals (for example v1n, v1p) is a voltage signal; the at least two output signals (OUTP, OUTN) are current signals; and each output signals of each of the plurality of Gm sections (412, 414, 416, 418, 420) is a current signal. In a next embodiment, the at least a first precharge switch and a second precharge switch (402, 404) comprise precharged output nodes of the plurality of Gm sections (412, 414, 416, 418, 420) for voltage VDD in a first phase; and wherein the at least a discharge switch (408) comprises discharged output nodes of the plurality of Gm sections (412, 414, 416, 418, 420) through respective the resistors (for example 430 (if 412)) for ground in a second phase. For yet another embodiment, for each of the plurality of Gm sections (412, 414, 416, 418, 420), the differential pair of transistors (for example 426, 428 (if 412)) is connected to the pair of resistors (for example 430 (if 412)) and the at least a first precharge switch and a second precharge switch (402, 404); wherein the pair of resistors (for example 430 (if 412)) is connected to the at least a discharge switch (408); and wherein the first and second input signals (for example v1p, v1n) are applied to an input gate of the differential pair of transistors (for example 426, 428 (if 412)). In other embodiments, the at least a first and a second precharge switches (402, 404) are p-type MOS transistors and the at least a discharge switch (408) is an n-type MOS transistor. In additional embodiments, each the differential pair of transistors (for example 426, 428 (if 412)) is comprised of a cascode stage (for example 426, 428+464, 466 (if 412)). Another embodiment includes an n-th level quantizer (for example, a 15th-level embedded adder quantizer such as a 15th-level× adder embedded dynamic preamplifier (as with FIG. 4) plus a regeneration latch and an SR latch (as with FIG. 5) comprising a plurality of the adder-embedded dynamic preamplifier system (400) of claim 1 (n×preamplifier); and a plurality of latches (such as a regeneration latch and/or an SR latch)(n× latch) connected to the adder-embedded dynamic preamplifier system (400), which receives the at least two output signals (OUTP, OUTN). Still other embodiments provide that the adder-embedded dynamic preamplifier system (400) adds output signals of integrators (for example 120, 150, 145) multiplied by predetermined gains, and outputs a quantized signal (V); wherein the output quantized signal (V) is fed back to an input signal (U) thereby providing a modulator.

An additional embodiment includes a method for preamplification, the method comprising the steps of: precharging outputs OUTP and OUTN to voltage VDD in a first phase; evaluating the outputs depending on input values in a second phase, wherein discharging currents are decided by the input values proportionately; and amplifying discharging differences of the output OUTN and the output OUTP by latch, following degeneration. Still further embodiments provide that the step of evaluating comprises a first reference signal and a second reference signal; the outputs comprise current signals; the step of precharging initiates when a charging signal (CLK) is set to enable; the step of amplifying comprises regenerative latch and SR latch; and all inputs are added together in current mode. A further embodiment related to FIG. 4 provides a modulator comprising an n-th level quantizer comprising a plurality of adder-embedded dynamic preamplifier system (400); and a plurality of latches (such as a regeneration latch and/or an SR latch) connected to the adder-embedded dynamic preamplifier system (400), which receives the at least two output signals (OUTP, OUTN), thereby providing an embedded adder quantizer; the adder-embedded dynamic preamplifier system (400) comprising at least a first precharge switch (402) and a second precharge switch (404); at least a discharge switch (408); and a plurality of Gm sections (for example 426, 428 (for 412)), each comprising at least a differential pair of transistors (for example 426, 428 (for 412)) and a pair of resistors (for example 430 (for 412)), thereby providing a Gm cell; wherein one of the Gm sections (ex. 412) receives reference signals (refp, refn), another each of the Gm sections (for example 414, 416, . . . ) receives input signals (for example v1p, v1n, v2p, v2n, . . . ), wherein the preamplifier system (400) generates two output signals (OUTP, OUTN); the output signals comprising summation of the output signals of the plurality of Gm sections; wherein the plurality of Gm sections (412, 414, 416, 418, 420) are precharged by the at least a first precharge switch and a second precharge switch (402, 404) and the plurality of Gm sections are discharged by the at least a discharge switch (408); wherein each resistor of the pair of resistors (for example 438 (if 414)) determines gain of each of the Gm cells for each of the input signals (for example v1n, v1p) for a function of subtraction; and wherein each ratio of each of the resistors (for example 438 (if 414)) decides each Gm (or gain) ratio of each of the first input signals (for example v1n, v1p) for a function of subtraction; wherein the at least a first precharge switch and a second precharge switch (402, 404) comprise precharged output nodes of the plurality of Gm sections (412, 414, 416, 418, 420) for voltage VDD in a first phase; wherein the at least a discharge switch (408) comprises discharged output nodes of the plurality of Gm sections (412, 414, 416, 418, 420) through respective the resistors (for example 430 (if 412)) for ground in a second phase; wherein for each of the plurality of Gm sections (412, 414, 416, 418, 420), the differential pair of transistors (for example 426, 428 (if 412)) is connected to the pair of resistors (for example 430 (if 412)) and the at least a first precharge switch and a second precharge switch (402, 404), wherein the pair of resistors (for example 430 (if 412)) is connected to the at least a discharge switch (408), wherein the first and second input signals (for example v1p, v1n) are applied to an input gate of the differential pair of transistors (for example 426, 428 (if 412)); wherein the adder-embedded dynamic preamplifier system (400) adds output signals of integrators (for example 120, 150, 145) multiplied by predetermined gains, and outputs a quantized signal (V); wherein the output quantized signal (V) is fed back to an input signal (U). Continued embodiments provide that each of the first and the second input signals is a voltage signal; the at least two output signals are current signals; and each output signals of each of the plurality of Gm sections is a current signal. In yet another following embodiment, the at least a first and a second precharge switches are p-type MOS transistors and the at least a discharge switch is an n-type MOS transistor.

One more embodiment of the present invention provides an adder-embedded dynamic preamplifier system with dynamic comparator and current mode adder comprising at least a first clock switch and a second clock switch for VDD; at least a third clock for ground; a reference section; a first section; a second section; a third section; and an input section; each of the reference section, the first section, the second section, the third section; and the input section is connected to OUTP and OUTN; the reference section comprises refn, refp, and reference resistors; the first section comprises 1st Int, v1n, v1p, and first section resistors; the second section comprises 2nd Int, v2n, v2p, and second sections resistors; the third section comprises 3rd Int, v3n, v3p, and third section resistors; and the input section comprises Input, vin, vip, and input resistors.

Another embodiment of the present invention provides a method for preamplification, the method comprising the steps of precharging outputs to VDD when clock equals low; evaluating outputs depending on input values when clock equals high, wherein discharging currents are decided by input values proportionately; and amplifying discharging difference of OUTN and OUTP by the latch, following degeneration.

The features and advantages described herein are not all-inclusive and, in particular, many additional features and advantages will be apparent to one of ordinary skill in the art in view of the drawings, specification, and claims. Moreover, it should be noted that the language used in the specification

DETAILED DESCRIPTION

The following detailed description provides example embodiments of the presently claimed invention with references to the accompanying drawings. The description is intended to be illustrative and not limiting the scope of the present invention. Embodiments are described in sufficient detail to enable one of ordinary skill in the art to practice the subject invention. Other embodiments may be practiced with some variations without departing from the spirit or scope of the subject invention.

Figure 4:
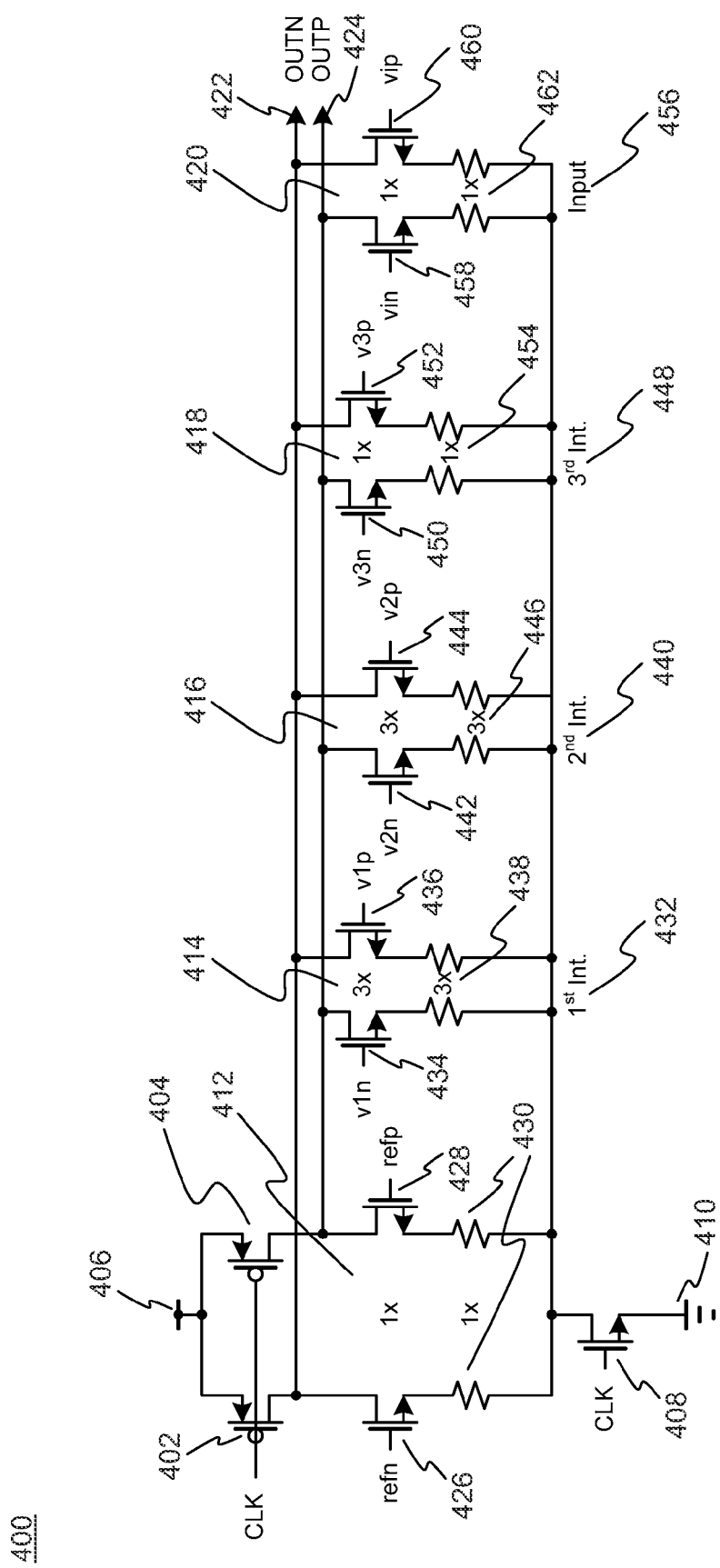
FIG. 4 is a schematic diagram illustrating an adder-embedded dynamic preamplifier system with dynamic comparator and current mode adder configured in accordance with one embodiment of the present invention.

FIG. 4 depicts adder-embedded dynamic preamplifier circuit embodiment 400. Outlined section of FIG. 1, embedded-adder quantizer 170, can be implemented with the novel circuit embodiment of FIG. 4. Circuit embodiment 400 comprises a first clock switch 402 and a second clock switch 404 for VDD 406, a third clock 408 for ground 410, reference section 412, first section 414, second section 416, third section 418, and input section 420, each connected to output OUTP 422 and inverted output OUTN 424 with the denoted gains. Reference section 412 comprises inverted reference refn 426, reference refp 428, and resistors 430 which decide Gm (or gain) of input pair for the function of subtraction. First section 414, comprises $1^{st}$ Int. 432, v1n 434, v1p 436, and resistors (in embodiments, three of 430 in parallel connection) 438. Second section 416 comprises $2^{nd}$ Int. 440, v2n 442, v2p 444, and resistors (in embodiments, three of 430 in parallel connection) 446. Third section 418 comprises $3^{nd}$ Int. 448, v3n 450, v3p 452, and resistors (in embodiments, same value as 430) 454. Input section 420 comprises Input 456, vin 458, vip 460, and resistors (in embodiments, same value as 430) 462.

Figure 3:
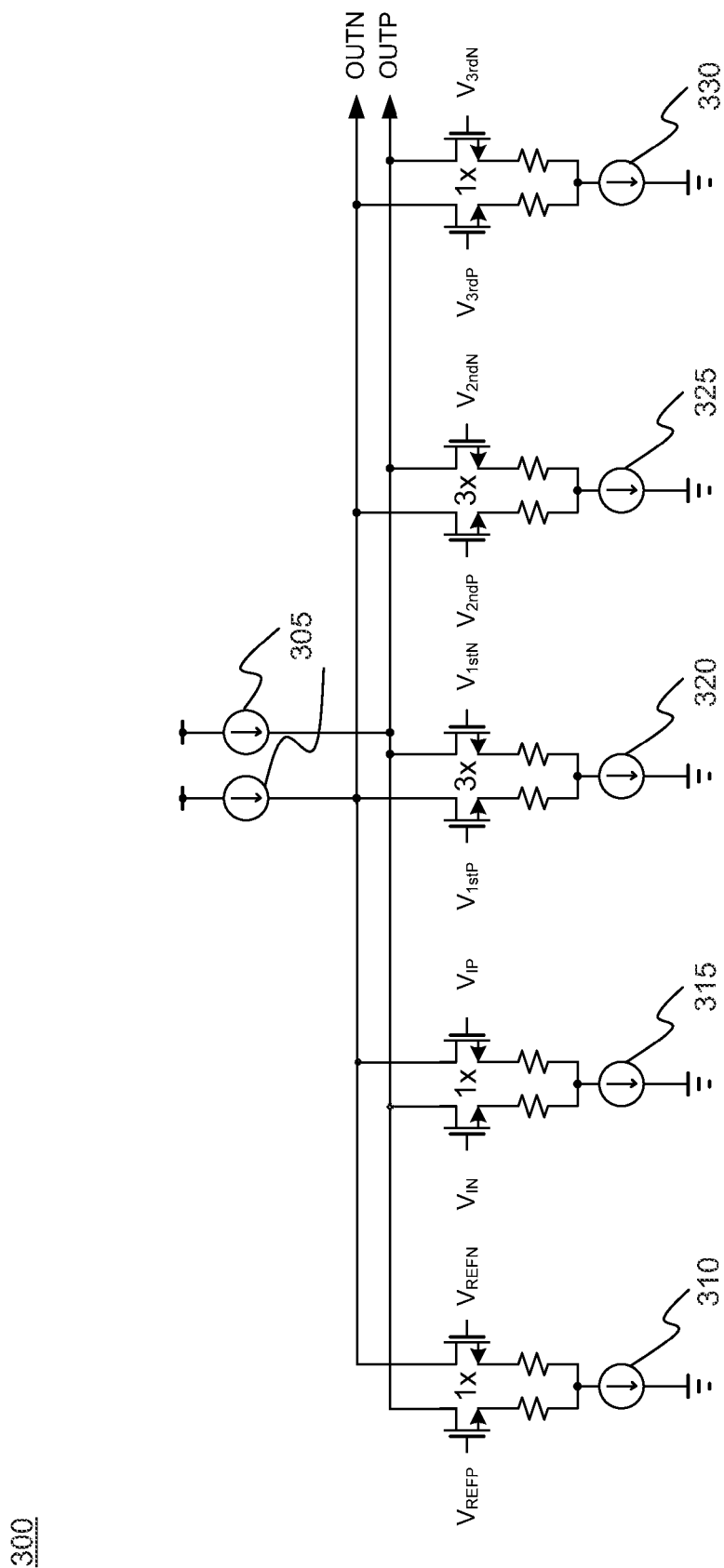
FIG. 3 is a diagram illustrating a conventional gm-cell-based current mode adder.

Precharged voltages are provided by switches. When CLK="L", outputs are precharged to VDD. When CLK="H", outputs are evaluated depending on input values. Each input pair works like a transconductance (Gm)-cell of FIG. 3 however, without constant DC current consumption, which is large, to achieve wide band operation. Discharging currents are decided by input values proportionally. Since this operation is done within the preamplifier, only the polarity of outputs is important because the discharging difference of OUTN and OUTP is amplified by the following regeneration latch and the SR latch. Hence, the settling requirements of the adder can be considerably relaxed.

Figure 1:
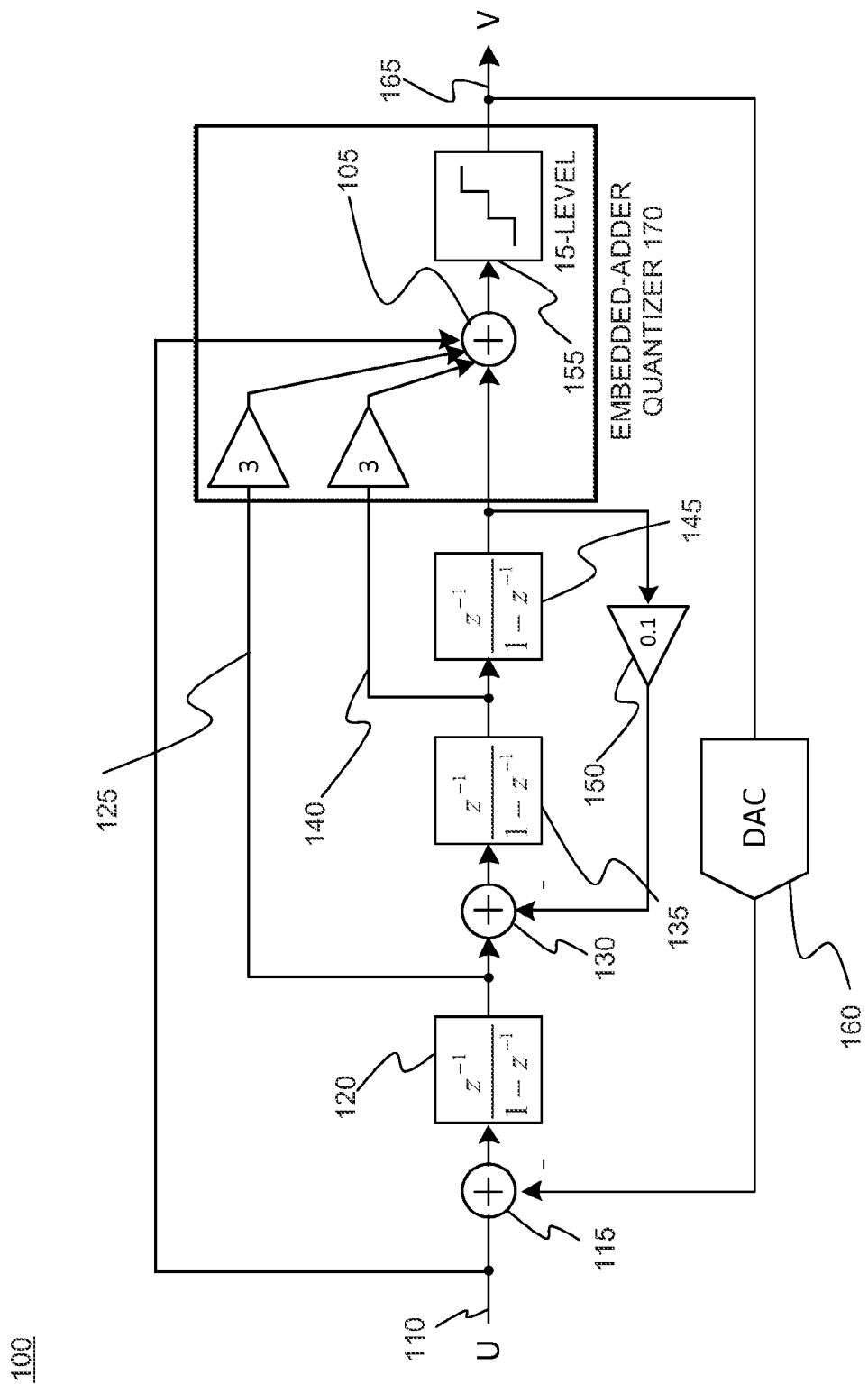
FIG. 1 is a block diagram of a known third-order modulator including a conventional switched-capacitor-based high-order active adder.
Figure 2:
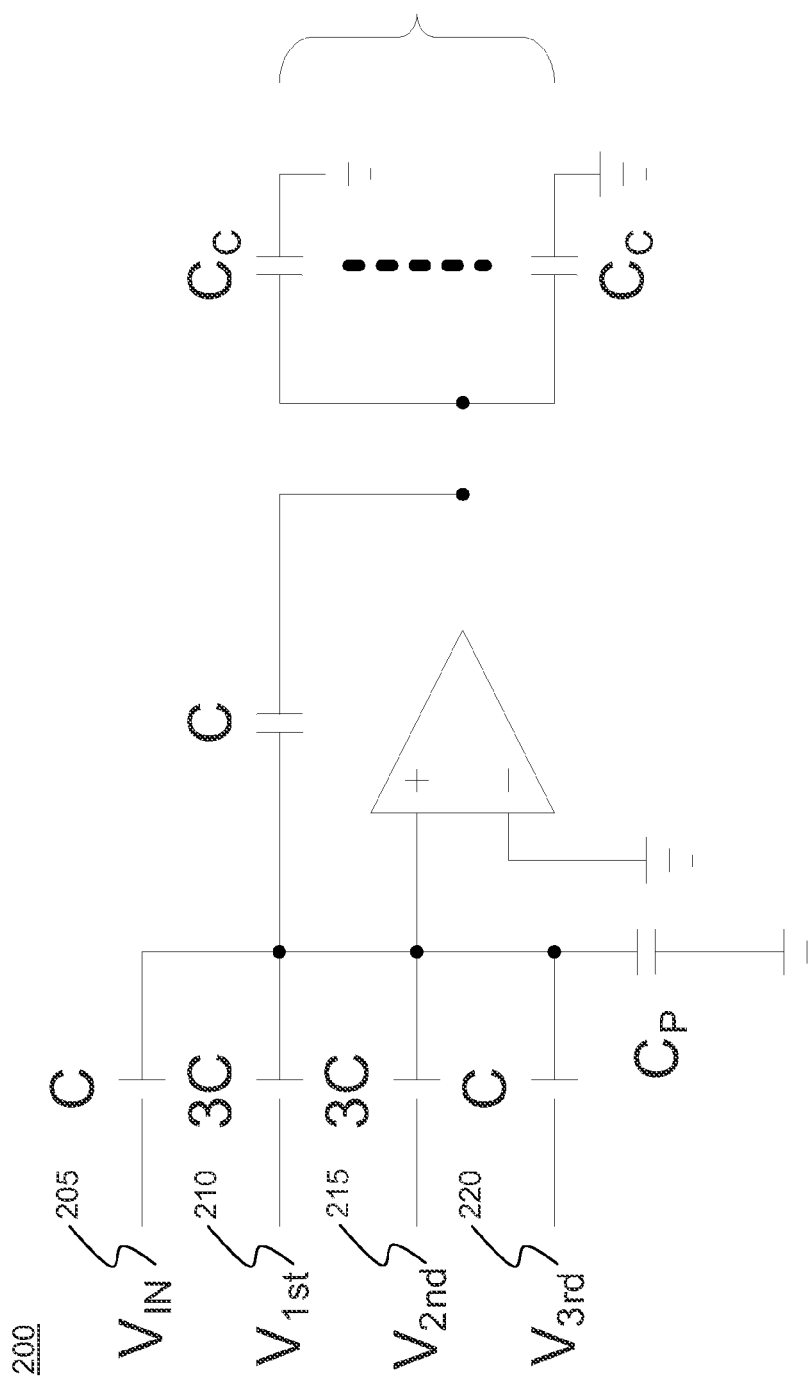
FIG. 2 is a diagram illustrating a conventional switched-capacitor-based active adder detail of FIG. 1 when the adder is in the addition mode.
Figure 5:
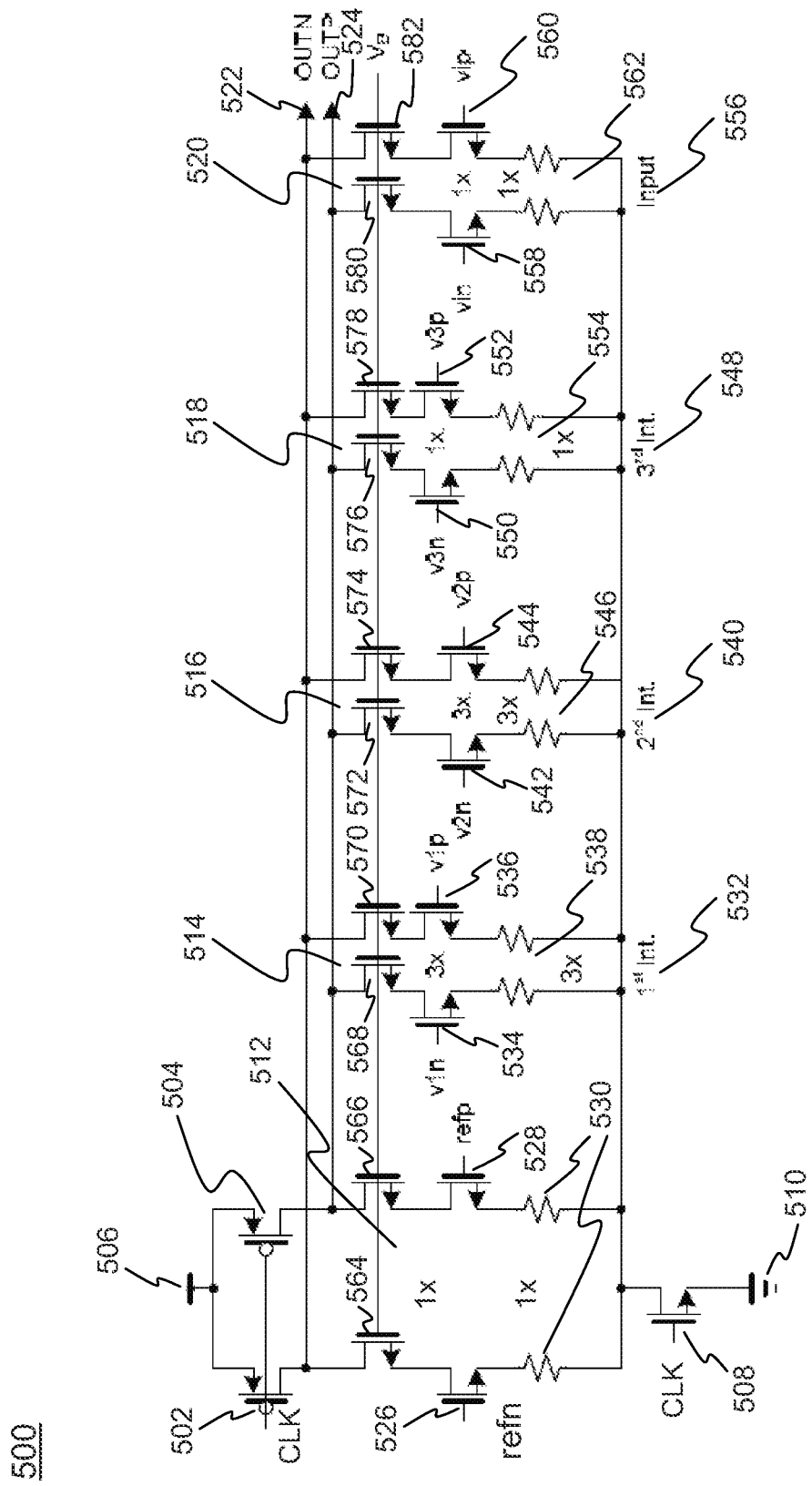
FIG. 5 is a schematic diagram illustrating an embedded-adder preamplifier system with cascode stages configured in accordance with one embodiment of the present invention.

FIG. 5 is a schematic diagram 500 illustrating an embedded-adder preamplifier system using cascode stages 564-582 (MC1-MC10) which merges the framed parts of FIG. 1, 170, i.e., the adder, the preamplifiers of the quantizer, and the gain blocks. It is an open-loop current-mode adder.

Circuit embodiment 500 comprises a first clock switch 502 and a second clock switch 504 for VDD 506, a third clock 508 for ground 510, reference 512, first 514, second 516, third 518, and input 520 sections, each connected to output OUTP 522 and inverted output OUTN 524 with the denoted gains. Reference section 512 comprises inverted reference refn 526, reference refp 528, and resistors 530 which decide Gm (or gain) of input pair for the function of subtraction. First section 514, comprises $1^{st}$ Int. 532, v1n 534, v1p 536, and resistors (in embodiments, three of 530 in parallel connection) 538. Second section 516 comprises $2^{nd}$ Int. 540, v2n 542, v2p 544, and resistors (in embodiments, three of 530 in parallel connection) 546. Third section 518 comprises $3^{nd}$ Int. 548, v3n 550, v3p 552, and resistors (in embodiments, same value as 530) 554. Input section 520 comprises Input 556, vin 558, vip 560, and resistors (in embodiments, same value as 530) 562. Cascode stages comprise differential input pair transistors 564, 566, 568, 570, 572, 574, 576, 578, 580, and 582.

The operation of embodiments of the adder is as follows. When CLK is "LOW", nodes OUTP and OUTN are precharged to VDD, the power supply voltage of the quantizer. Transistors 526, 528, 534, 536, 542, 544, 550, 552, 558, and 560 ($M_{I1}$ to $M_{I10}$) are differential input pairs, used to process the reference voltages, input signals, and outputs of integrators. Resistors are connected to their sources to achieve constant $G_m$s even with large input swings and common mode variations. All inputs are added together in the current mode, after CLK goes "HIGH", and the evaluation starts to detect speed differences between the discharging output nodes. With dynamic operation, the transconductances of 526, 528, 534, 536, 542, 544, 550, 552, 558, and 560 ($M_{I1}$-$M_{I10}$) can be designed large enough even with source degeneration resistors, and without static power consumption, because the currents of the input transistors only discharge the parasitic capacitors of OUTP and OUTN. For embodiments, gains of the input branches are set by sizing the transistors and resistors. For embodiments, the input branches connected to reference voltages have a gain of 2 to reduce nonlinearity when the reference voltages are too low. This dynamic operation provides high speed, by eliminating the static bias currents that slow down the discharging of the outputs. In embodiments, a total of 14 preamplifiers are required to build a 15-level quantizer. To reduce the kickback noise to sampling capacitors and integrators, cascode stages 564-582 ($M_{C1}$-$M_{C10}$) are used. The comparator samples data without switched-capacitor samplers, and hence it allows additional digital power saving.

Figure 6:
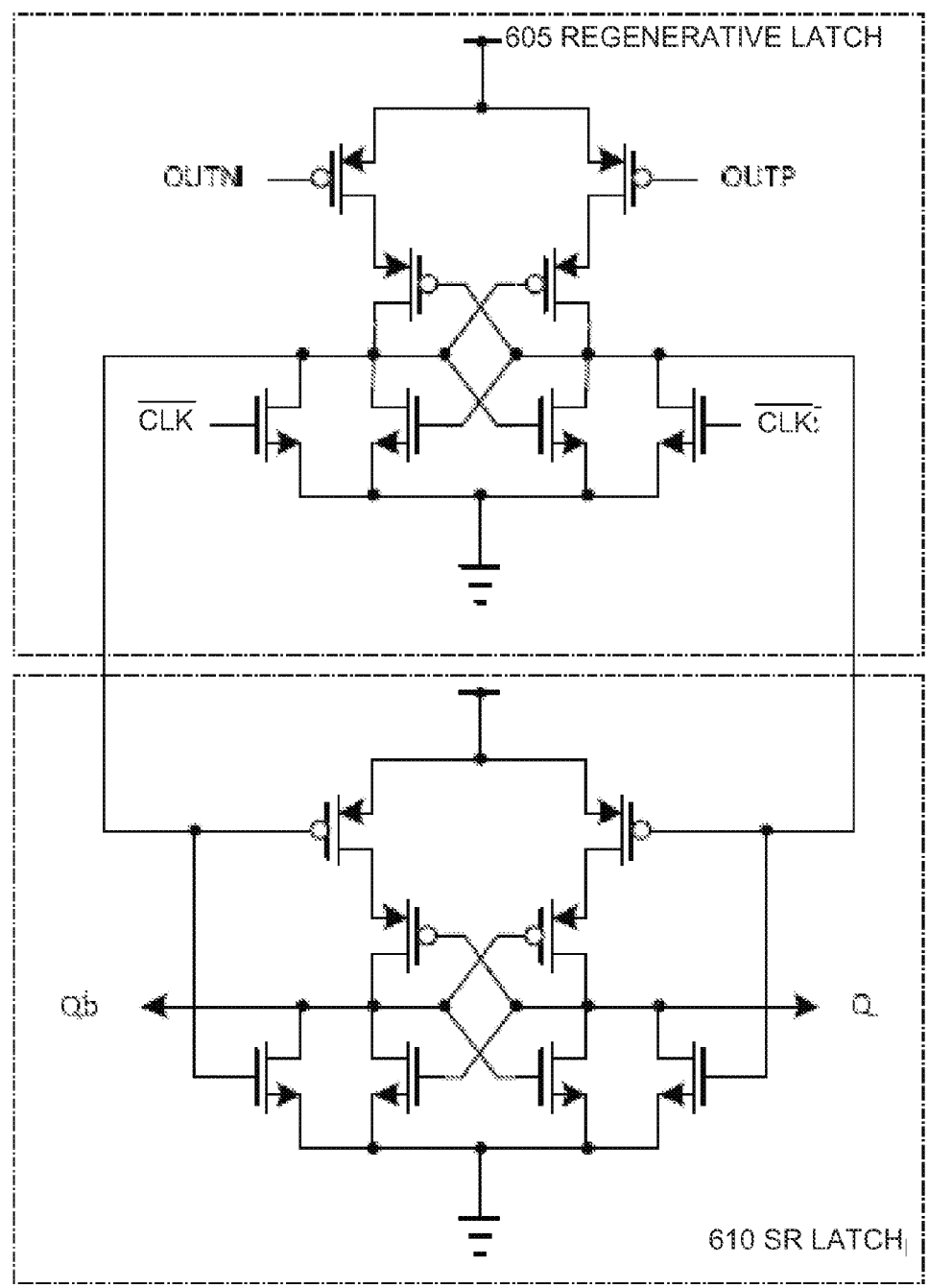
FIG. 6 is a schematic diagram illustrating a regenerative latch and SR latch configured in accordance with one embodiment of the present invention.

FIG. 6 is a schematic diagram 500 illustrating a regenerative latch 605 and SR latch 610 configured in accordance with one embodiment of the present invention. The regenerative latches of FIG. 6 sample the voltage difference between two outputs of preamplifiers during the transition, and the SR latches hold data when CLK is high. Thanks to the low opamp output swings in the low-distortion architecture with the 15-level quantizer, for embodiments, telescopic opamps are used to save power.

Figure 7:
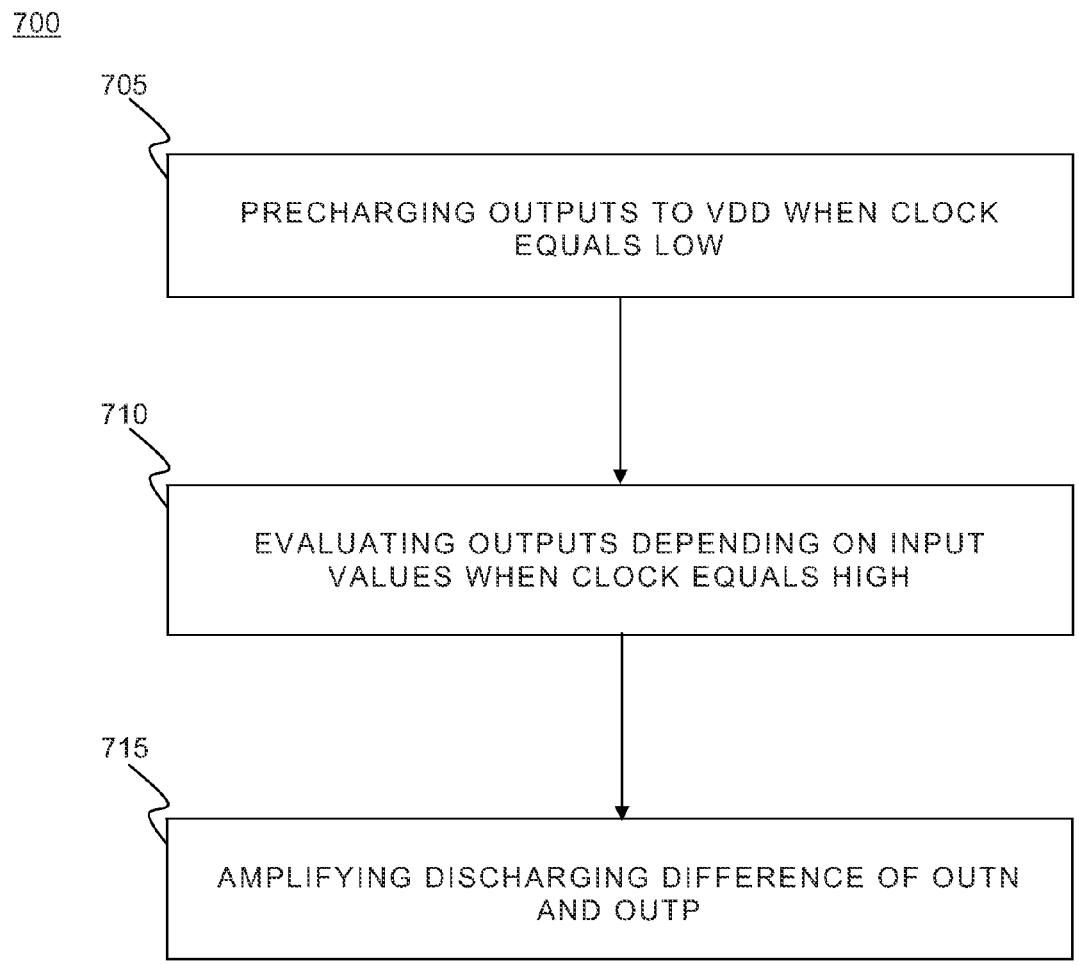
FIG. 7 is a flow chart depicting a dynamic preamplifier method configured in accordance with one embodiment of the present invention.

FIG. 7 is a flow chart 700 depicting an embodiment of a dynamic preamplifier method. The method steps comprise precharging outputs to VDD when clock equals low 705; evaluating outputs depending on input values when clock equals high 710, wherein discharging currents are decided by input values proportionately; and amplifying discharging difference of OUTN and OUTP by the latch, following degeneration 715.

The foregoing description of the embodiments of the invention has been presented for the purposes of illustration and description. Each and every page of this submission, and all contents thereon, however characterized, identified, or numbered, is considered a substantive part of this application for all purposes, irrespective of form or placement within the application. This specification is not intended to be exhaustive or to limit the invention to the precise form disclosed. Many modifications and variations are possible in light of this disclosure.

What is claimed is:

1. An adder-embedded dynamic preamplifier system comprising:
   at least a first precharge switch and a second precharge switch;
   at least a discharge switch; and
   a plurality of Gm sections, each comprising at least a differential pair of transistors and a pair of resistors, thereby providing a Gm cell;
   wherein one of said Gm sections receives reference signals, and another of said Gm sections receives input signals;
   wherein said preamplifier system generates two output signals;
   said output signals comprising summation of said output signals of said plurality of Gm sections;
   wherein said plurality of Gm sections are precharged by said at least a first precharge switch and a second precharge switch and said plurality of Gm sections are discharged by said at least a discharge switch.

2. The adder-embedded dynamic preamplifier system of claim 1:
   wherein each resistor of said pair of resistors determines gain of each of said Gm cells for each of said input signals for a function of subtraction; and
   wherein each ratio of each of said resistors decides each Gm ratio of each of said first input signals for a function of subtraction.

3. The adder-embedded dynamic preamplifier system of claim 1:
   wherein each of said first and said second input signals is a voltage signal;
   said at least two output signals are current signals;
   and each output signals of each of said plurality of Gm sections is a current signal.

4. The adder-embedded dynamic preamplifier system of claim 1:
   wherein said at least a first precharge switch and a second precharge switch comprise precharged output nodes of said plurality of Gm sections for voltage VDD in a first phase; and
   wherein said at least a discharge switch comprises discharged output nodes of said plurality of Gm sections through respective said resistors for ground in a second phase.

5. The adder-embedded dynamic preamplifier system of claim 1:
   wherein for each of said plurality of Gm sections,
   said differential pair of transistors is connected to said pair of resistors and said at least a first precharge switch and a second precharge switch;
   wherein said pair of resistors is connected to said at least a discharge switch; and
   wherein said first and second input signals are applied to an input gate of said differential pair of transistors.

6. The adder-embedded dynamic preamplifier system of claim 1:
   wherein said at least a first and a second precharge switches are p-type MOS transistors and said at least a discharge switch is an n-type MOS transistor.

7. The adder-embedded dynamic preamplifier system of claim 1:
   wherein each said differential pair of transistors is comprised of a cascode stage.

8. An n-th level quantizer comprising:
   a plurality of said adder-embedded dynamic preamplifier system of claim 1; and
   a plurality of latches connected to said adder-embedded dynamic preamplifier system, which receives said at least two output signals.

9. The adder-embedded dynamic preamplifier system of claim 1, wherein said adder-embedded dynamic preamplifier system adds output signals of integrators multiplied by predetermined gains, and
   outputs a quantized signal (V);
   wherein said output quantized signal (V) is fed back to an input signal (U) thereby providing a modulator.

10. A method for preamplification, said method comprising the steps of:
    precharging outputs OUTP and OUTN to voltage VDD in a first phase;
    evaluating said outputs depending on input values in a second phase, wherein discharging currents are decided by said input values proportionately; and
    amplifying discharging differences of said output OUTN and said output OUTP by latch, following degeneration.

11. The method of claim 10, wherein said step of evaluating comprises a first reference signal and a second reference signal.

12. The method of claim 10 wherein said outputs comprise current signals.

13. The method of claim 10 wherein said step of precharging initiates when a charging signal is set to enable.

14. The method of claim 10 wherein said step of amplifying comprises regenerative latch and SR latch.

15. The method of claim 10, wherein all inputs are added together in current mode.

16. A modulator comprising:
    an n-th level quantizer comprising: a plurality of adder-embedded dynamic preamplifier system; and a plurality of latches connected to said adder-embedded dynamic preamplifier system, which receives said at least two output signals (OUTP, OUTN), thereby providing an embedded adder quantizer;
    said adder-embedded dynamic preamplifier system comprising:
    at least a first precharge switch and a second precharge switch;
    at least a discharge switch; and
    a plurality of Gm sections, each comprising at least a differential pair of transistor and a pair of resistors, thereby providing a Gm cell;

wherein one of said Gm sections receives reference signals, and another of said Gm section receives input signals, wherein said preamplifier system generates said two output signals (OUTP, OUTN);

said output signals comprising summation of said output signals of said plurality of Gm sections;

wherein said plurality of Gm sections are precharged by said at least a first precharge switch and a second precharge switch and said plurality of Gm sections are discharged by said at least a discharge switch;

wherein each resistor of said pair of resistors determines gain of each of said Gm cells for each of said input signals for a function of subtraction; and wherein each ratio of each of said resistors decides each Gm ratio of each of said first input signals for a function of subtraction;

wherein said at least a first precharge switch and a second precharge switch comprise precharged output nodes of said plurality of Gm sections for voltage VDD in a first phase;

wherein said at least a discharge switch comprises discharged output nodes of said plurality of Gm sections through respective said resistors for ground in a second phase;

wherein for each of said plurality of Gm sections, said differential pair of transistors is connected to said pair of resistors and said at least a first precharge switch and a second precharge switch, wherein said pair of resistors is connected to said at least a discharge switch, wherein said first and second input signals are applied to an input gate of said differential pair of transistors;

wherein said adder-embedded dynamic preamplifier system adds output signals of integrators multiplied by predetermined gains, and outputs a quantized signal (V);

wherein said output quantized signal (V) is fed back to an input signal (U).

17. The modulator of claim 16, wherein each of said first and said second input signals is a voltage signal;

said at least two output signals are current signals;

and each output signals of each of said plurality of Gm sections is a current signal.

18. The modulator of claim 16, wherein said at least a first and a second precharge switches are p-type MOS transistors and said at least a discharge switch is an n-type MOS transistor.

* * * * *